United States Patent [19]

Osada et al.

[11] Patent Number: 5,448,107
[45] Date of Patent: Sep. 5, 1995

[54] RADIATING FIN HAVING AN IMPROVED LIFE AND THERMAL CONDUCTIVITY

[75] Inventors: Mitsuo Osada; Yugaku Abe, both of Hyogo, Japan

[73] Assignee: Sumitomo Electric Industries, Ltd., Osaka, Japan

[21] Appl. No.: 950,727

[22] Filed: Sep. 24, 1992

Related U.S. Application Data

[63] Continuation of Ser. No. 632,153, Dec. 21, 1990, abandoned.

[30] Foreign Application Priority Data

Dec. 29, 1989 [JP] Japan .................. 1-339981

[51] Int. Cl.$^6$ ........................... H01L 23/14
[52] U.S. Cl. ..................... 257/706; 257/707;
257/712; 257/722; 257/720
[58] Field of Search ............ 257/706, 707, 712, 722, 257/720

[56] References Cited

U.S. PATENT DOCUMENTS

| | | | |
|---|---|---|---|
| 4,227,036 | 10/1980 | Fitzgerald | 357/81 |
| 4,546,409 | 10/1985 | Yoshino et al. | 357/81 |
| 4,620,215 | 10/1986 | Lee | 357/81 |
| 4,749,627 | 6/1988 | Ishikawa et al. | 357/81 |
| 4,757,934 | 7/1988 | Greenstein | 357/81 |

FOREIGN PATENT DOCUMENTS

| | | | |
|---|---|---|---|
| 0158654 | 12/1980 | Japan | 357/81 |
| 58-70561 | 4/1983 | Japan . | |
| 58-147050 | 9/1983 | Japan | 357/81 |
| 62-279089 | 12/1987 | Japan . | |
| 63-34495 | 2/1988 | Japan . | |
| 64-86542 | 3/1989 | Japan . | |
| 2-31863 | 7/1990 | Japan . | |

Primary Examiner—David C. Nelms
Assistant Examiner—Viet Q. Nguyen
Attorney, Agent, or Firm—W. G. Fasse; D. H. Kane, Jr.

[57] ABSTRACT

A semiconductor device has a heat radiating fin attached to a semiconductor packaging device which holds a semiconductor element for externally diffusing heat generated by the semiconductor element. The fin is light in weight and has an improved thermal conductivity, since the heat radiating fin is made of an aluminum alloy or of a pure aluminum secured to a connecting member by a direct metallic bond. The connecting member is made of a Mo—Cu composite material. The fin and the connecting member are friction welded to each other to form the metallic bond at an interface between the fin and the connecting member.

12 Claims, 9 Drawing Sheets

RADIATING FIN HAVING AN IMPROVED LIFE AND THERMAL CONDUCTIVITY

This application is a continuation of application Ser. No. 07/632,153, filed on Dec. 21, 1990, abandoned.

FIELD OF THE INVENTION

The present invention relates to a radiating fin and, more specifically, to a light radiating fin having an improved thermal conductivity.

BACKGROUND INFORMATION

Figure 11:
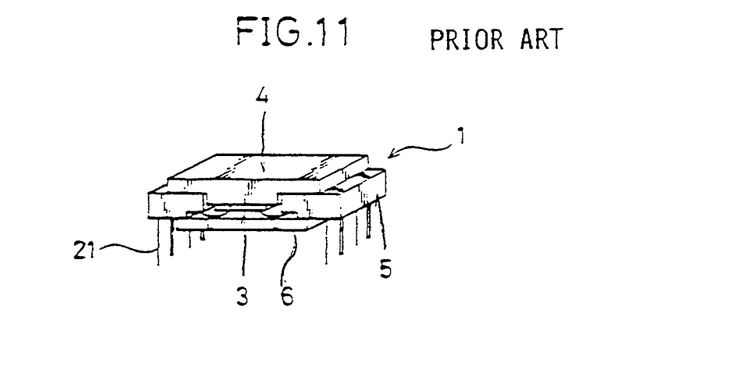
FIG. 11 is a perspective view of a conventional semiconductor packaging device.

FIG. 11 is a perspective view of a conventional semiconductor packaging device 1 comprising a substrate 4 for mounting a semiconductor device 3, and a package 5 having a space for accommodating the semiconductor device 3 and for supporting the substrate 4. The package 5 is closed downwardly by a lead member 6. A lead wire 21 is electrically connected to the semiconductor device 3.

Recently, the speed of operation and capacity of ICs have been increased and the ICs have come to be used with higher frequencies, so that the ability of such semiconductor devices 3 has been increased The packaging device shown in FIG. 11 can not sufficiently diffuse or discharge the generated heat out of the device. Accordingly, there have been various demands for radiating fins for diffusing the generated heat to the outside of the semiconductor packaging device 1. These heat radiating fins must be light in weight and have a high thermal conductivity.

Figure 12:
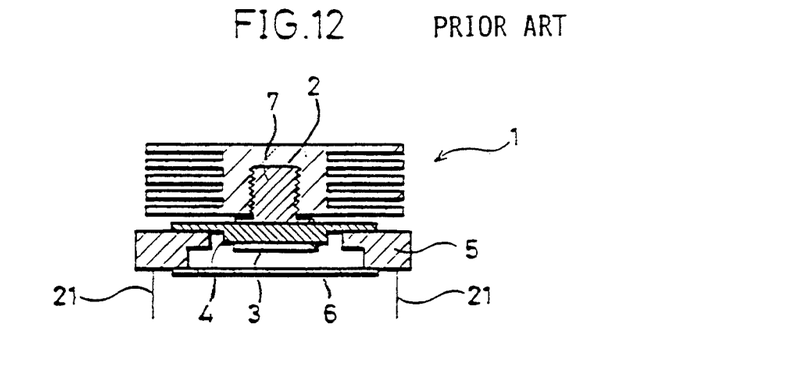
FIG. 12 is a cross-sectional view of a conventional semiconductor packaging device comprising a radiating fin.

FIG. 12 is a cross-sectional view of a conventional semiconductor packaging device having a radiating fin 2 attached to the semiconductor packaging device of FIG. 11. The substrate 4 is made of a Mb—W composite material or a Cu—W composite material. The package 5 is made of alumina. The lead member 6 is made of Kovar (29% Ni—17% Co—Fe). The radiating fin 2 is formed of an aluminum alloy which is light in weight. The radiating fin 2 is attached to the rear surface of the substrate 4 by a screw 7 provided on the rear surface of the substrate 4.

Figure 13:
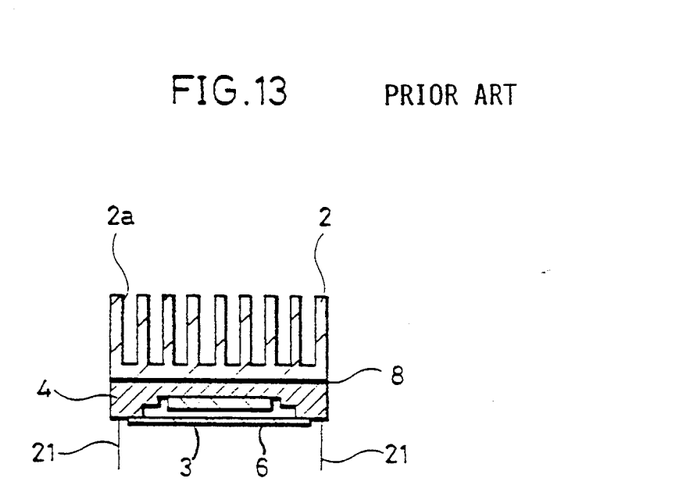
FIG. 13 is a cross-sectional view of another conventional semiconductor packaging device comprising a radiating fin.

FIG. 13 is a cross-sectional view of a conventional compact semiconductor packaging device having a radiating fin similar to that of FIG. 12, except for the following points. Thus, corresponding portions are denoted by the same reference numerals and the description thereof is not repeated.

In order to make the device more compact, wings 2a of the radiating fin 2 are structured to project upwardly. The radiating fin 2 is adhered to the substrate 4 by an adhesive 8 including a filler with good thermal conductivity.

The conventional semiconductor packaging device having the radiating fin structured as described above has the following disadvantages. Namely, when the radiating fin 2 is connected to the substrate 4 by means of a screw 7 as shown in FIG. 12, the area of contact between the radiating fin 2 and the substrate 4 cannot be made sufficiently large, so that heat radiation is insufficient. Further, when the radiating fin 2 and the substrate 4 are connected by an adhesive 8 as shown in FIG. 13, heat radiation is also insufficient since the thermal conductivity of the adhesive 8 is inferior. In the semiconductor packaging device shown in FIG. 13, the thermal expansion coefficient of the substrate 4 made of a Mb—W composite material or a Cu—W composite material, and the thermal expansion coefficient of the package 5 made of alumina are different from that of the radiating fin 2 made of aluminum. As a result, peeling occurs after connection at the boundary during a heat cycle test, generally performed in the range of $-50°$ C. to $150°$ C., 300 cycles. Such peeling is a problem in actual use.

In order to solve the above described problem, the inventors of the present invention used Mo—Cu composite materials or W—Cu composite materials separately developed for substrates for loading semiconductor devices (Japanese Patent Publication No. 2-31863) for making the radiating fin The thermal expansion coefficient of the Mo—Cu composite materials or of W—Cu composite materials is near that of aluminum or Kovar. Therefore, the above mentioned problem of peeling does not arise during the heat cycle test, when these composite materials are used for the radiating fin. The Mo—Cu composite materials and W—Cu composite materials provide a heat radiating fin having superior thermal characteristics. Especially, the Mo—Cu composite materials having a relatively small specific gravity of 9 to 10 g/cc are practically used at present for making the light radiating fins.

However, even the Mo—Cu composite materials are heavier than aluminum having a specific gravity of 2.7 g/cc which has been used for making the radiating fins. Thus, fins of Mo—Cu are too heavy, especially when they are used for making a large radiating fin recently demanded for large semiconductor chips.

Figure 14:
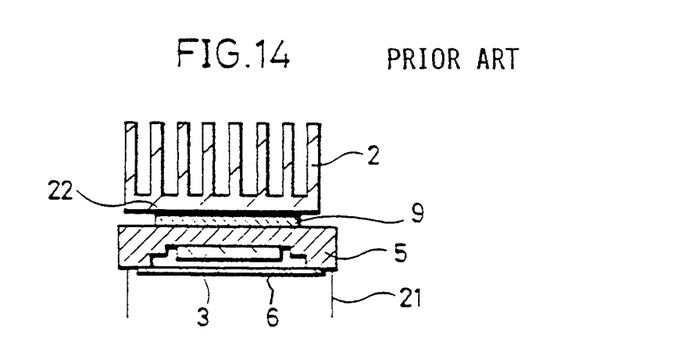
FIG. 14 is a cross-sectional view of a further conventional semiconductor packaging device comprising a radiating fin.

In order to solve this problem, the Mo—Cu composite material is used to make the connecting member 9 for connecting the radiating fin 2 made of aluminum and the package 5 made of alumina, and the connecting member 9 and the radiating fin 2 is connected by a solder 22, lead—tin, gold—tin alloy, and so on, as shown in FIG. 14.

However, referring to FIG. 14, the aluminum, which is the material of the radiating fin 2 is readily oxidized and normally the surface thereof is covered with a thin oxide film. Therefore wetting by the solder is not good, and plating, normally nickel plating after zincate processing, is necessary on the surface of the aluminum to enable soldering. Further, molybdenum existing at the junction surface of the Mo—Cu composite material constituting the connecting member 9, makes the wetting by the solder worse. Accordingly, the junction surface of the Mo—Cu composite material must be plated by nickel plating or the like to enable soldering. In addition, when both are connected by soldering, a certain number of cavities are generated in the soldering layer. Such cavities prevent a good thermal conduction. The thermal conductivity of the solder itself is low, and therefore the solder material also prevents a good thermal conduction.

Referring to FIG. 14, the body formed by the fin 2 and by the connecting member 9 provided by the above described method, must be plated with nickel, nickel+-gold, or the like after soldering; in order to provide corrosion resistance. However, plating of the body by various and many materials was difficult, since various materials react differently against chemicals.

SUMMARY OF THE INVENTION

An object of the present invention is to provide a radiating fin whereby the fin and connecting portion are coupled firmly with each other and with the package.

Another object of the present invention is to provide a lightweight radiating fin.

A further object of the present invention is to provide a radiating fin having a superior thermal conductivity.

A still further object of the present invention is to provide a radiating fin which is both lightweight and has a superior thermal conductivity.

A still further object of the present invention is to provide a radiating fin which can be easily plated for providing corrosion resistance.

According to the invention a semiconductor device comprises a radiating fin mounted on a semiconductor packaging device for the semiconductor device for externally diffusing heat generated from the semiconductor device, wherein the radiating fin is made of pure aluminum or an aluminum alloy, and a connecting member for connecting the fin to the semiconductor packaging device is made of a composite material selected from the group consisting of Mo—Cu, Cu—W and Al—Si, and wherein said fin and the connecting member are welded to each other by rotational friction along an interface between the fin and the connecting member.

In accordance with a preferred embodiment of the present invention, a tip end of the connecting member has a conical shape penetrating into the fin at the interface between the fin and the connecting member.

The radiating fin of the present invention is light in weight, since aluminum alloy is used for making the fin. The connecting member made of the composite material mentioned above and the fin are firmly bonded to each other by a metallic bond formed by the friction welding.

Each of the above mentioned materials Mo—Cu, Cu—W and Al—Si has superior thermal conductivity, and since there is no solder that could impair the heat conductivity across the interface between the fin and the connecting portion, the resulting radiating fin has a superior thermal conductivity.

The difference between thermal expansion coefficient of the connecting member made of the composite material selected from the group consisting of Mo—Cu, Cu—W and Al—Si, and that of the material forming the package is small, so that a thermal distortion such as peeling does not occur at the interface between the package and the connecting member. Namely, the radiating fin and the package are firmly connected to each other whereby the life thereof is made longer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in the following with reference to the figures.

Figure 1:
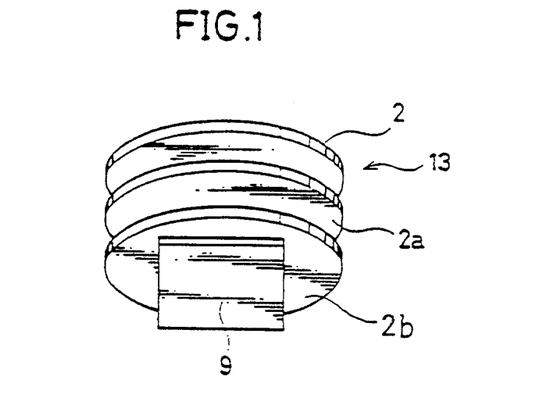
FIG. 1 is a perspective view of a radiating fin in accordance with one embodiment of the present invention.

Referring to FIG. 1, the radiating fin 13 has three fin sections 2, 2a, and 2b to be attached to a substrate for mounting a semiconductor device for externally diffusing heat generated by the semiconductor device. The radiating fin sections 2, 2a, 2b are made of an aluminum alloy. The fin sections are secured to a connecting member 9. The connecting member 9 is made of a composite material selected from the group of Mo—Cu, Cu—W or Al—Si. According to the invention the fin 13 and the connecting member 9 are friction welded to each other to provide a tight contact at an interface where the friction welding forms a metal bond.

Figure 2:
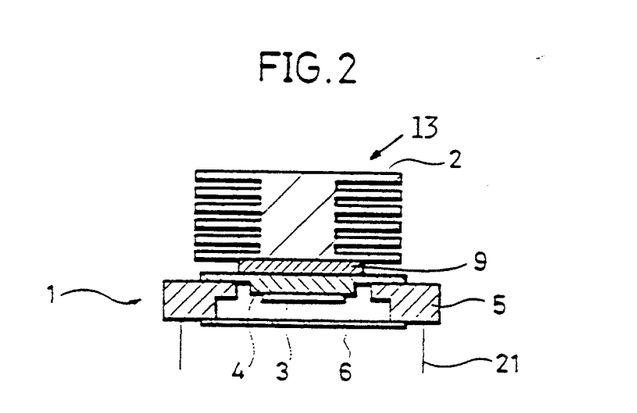
FIG. 2 is a cross-sectional view of a semiconductor packaging device with the radiating fin of FIG. 1 of the present invention.

FIG. 2 is a cross-sectional view of a semiconductor packaging device to which the radiating fin 13 in accordance with one embodiment is attached.

The semiconductor packaging device 1 comprises a substrate 4 for mounting the semiconductor device 3, and a package 5 having a space for accommodating the semiconductor device 3. The semiconductor device is secured to a downwardly facing surface of the substrate 4. The package 5 is closed downwardly by a lid 6. A lead wire 21 is electrically connected to the semiconductor device 3.

The radiating fin 13 with its connecting member 9 metal bonded to the fin, is fixed to the semiconductor packaging device 1 by attaching the connecting member 9 to the substrate 4 by a thermal conductive adhesive including an epoxy resin+Ag.

The substrate 4 is made of a Mb—W composite or a Cu—W composite. The package 5 is made of alumina. The lid 6 is made of Kovar (29%Ni—17%Co—Fe).

Table 1 shows the results of measuring the thermal expansion coefficient and the thermal conductivity of Cu—W alloy used for making the connecting member 9. Thermal expansion coefficients of $Al_2O_3$, Si, GaAs are also shown in the table.

TABLE 1

| No. | Alloy Composition (wt. %) | Thermal Expansion Coefficient ($\times 10-6/°C.$) | Thermal Conductivity (cal/cm · sec °C.) |
| --- | --- | --- | --- |
| 1* | 1Cu-99W | 4.7 | 0.40 |
| 2 | 5Cu-95W | 5.2 | 0.45 |
| 3 | 10Cu-90W | 7.0 | 0.50 |
| 4 | 15Cu-85W | 7.9 | 0.54 |
| 5 | 20Cu-80W | 8.3 | 0.58 |
| 6 | 25Cu-75W | 9.0 | 0.62 |
| 7 | 30Cu-70W | 9.7 | 0.65 |
| 8* | 35Cu-65W | 11.0 | 0.69 |
| 9* | 40Cu-60W | 11.8 | 0.73 |
| 10 | 10Cu-89W-1Ni | 7.0 | 0.48 |
| 11 | 20Cu-79.5W-0.5Ni | 8.2 | 0.57 |
| 12 | 5-Cu-80W-15Fe | 7.9 | 0.42 |
| 13 | 10Cu-79W-11Co | 8.1 | 0.46 |
| 14* | $Al_2O_3$ | 7.2 | |
| 15* | Si | 4.0 | |
| 16* | GaAs | 6.7 | |

As is apparent from Table 1, the difference between the thermal expansion coefficients of Cu—W alloy and $Al_2O_3$ becomes small when 2 to 30 weight % of Cu is included in the Cu—W alloy.

Table 2 shows the results of measuring the thermal expansion coefficient and the thermal conductivity of Mo—Cu alloy used for the connecting member 9 in accordance with another embodiment of the present invention.

TABLE 2

| No. | Alloy Composition (wt. %) | Thermal Expansion Coefficient ($\times 10-6/°C.$) | Thermal Conductivity (cal/cm · sec °C.) |
| --- | --- | --- | --- |
| 1* | 1Cu-99Mo | 5.3 | 0.35 |
| 2 | 5Cu-95Mo | 5.9 | 0.38 |
| 3 | 10Cu-90Mo | 6.5 | 0.41 |
| 4 | 15Cu-85Mo | 7.1 | 0.44 |
| 5 | 20Cu-80Mo | 7.9 | 0.48 |
| 6 | 25Cu-75Mo | 8.4 | 0.50 |
| 7 | 30Cu-70Mo | 9.1 | 0.54 |
| 8* | 35Cu-65Mo | 9.7 | 0.57 |
| 9* | 40Cu-60Mo | 10.3 | 0.60 |
| 10* | 50Cu-50Mo | 11.5 | 0.66 |
| 11 | 10Cu-89.5Mo-0.5Ni | 6.5 | 0.39 |
| 12 | 15Cu-82.0Mo-3.0Ni | 7.2 | 0.41 |
| 13 | 5-Cu-78Mo-17Fe | 8.2 | 0.36 |
| 14 | 10Cu-82Mo-8Co | 7.8 | 0.40 |

Referring to the tables, the Mo—Cu and Cu—W alloys have a superior thermal conductivity. In addition, since there is no solder between the fin 13 and the connecting member 9, which could decrease the thermal conductivity existing at the interface between the fin 13 and the connecting member 9, the present radiating fin 13 has a superior thermal conductivity compared to solder connections.

Since the difference between the thermal expansion coefficient of the connecting member 9 formed of Mo—Cu or Cu or Cu—W alloy, and that of the material such as Cu—W, $Al_2O_3$ or the like of the package 5, is small, a thermal distortion is not generated at the interface between the package 5 and the connecting member 9, whereby the radiating fin 13 is firmly connected to the package 5 and the life of the semiconductor packaging device has been improved.

Figure 3A:
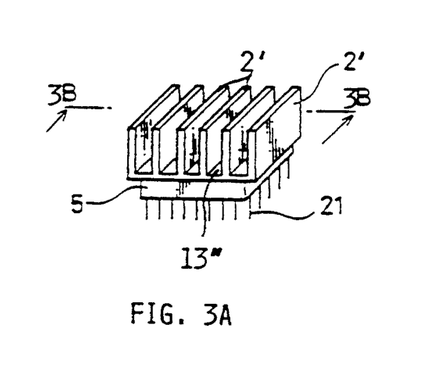
FIGS. 3A and 3B are a perspective view (FIG. 3A) and a cross-sectional view (FIG. 3B) respectively of the semiconductor packaging device comprising another radiating fin in accordance with another embodiment of the present invention.
Figure 3B:
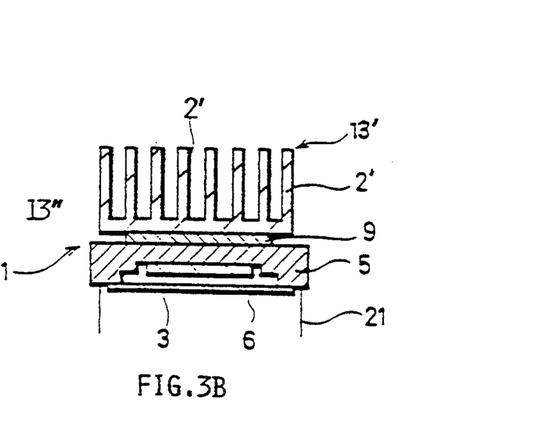

FIGS. 3A and 3B show a perspective and a cross-sectional view respectively of a semiconductor packaging device to which the radiating fin in accordance with another embodiment of the present invention is attached.

The perspective view of FIG. 3A of the present semiconductor packaging device shows the radiating fins 2'. FIG. 3B shows a cross-sectional view taken along the line 3B—3B of FIG. 3A showing a group 13' of cooling fins 2' connected to each other at 13'.

Referring to these figures, the semiconductor packaging device 1 comprises a package 5 made of alumina for accommodating the semiconductor device 3. A lid 6 made of Kovar is provided below the package 5. A lead wire 21 is electrically connected to the semiconductor device 3. The radiating fin group 13' comprises a plurality of fin wings 2' of aluminum alloy extending upwardly from a fin section 13" secured to the connecting member 9 made of a Mo—Cu, Cu—W or Al—Si alloy. The connecting member 9 and the fin section 13" are friction welded to each other to form a tight metal bond at the interface. The connecting member 9 is fixed to the package 5 by a heat conductive adhesive including an epoxy resin+Ag. Since the difference between the thermal expansion coefficients of the connecting member 9 and the package 5 is small, there is no thermal distortion at the boundary between the package 5 and the connecting member 9.

In this embodiment also, the radiating fin 13 and the package 5 are firmly interconnected, and the life thereof has been improved.

Figure 4A:
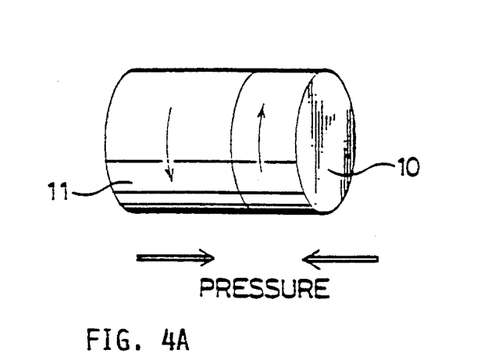
FIGS. 4A to 4C are schematic perspective views showing the steps of manufacturing the radiating fin in accordance with the present invention.
Figure 4B:
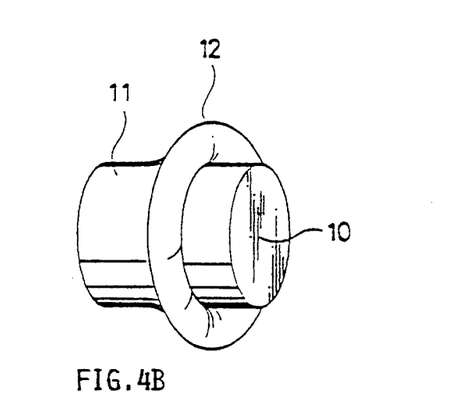
Figure 4C:
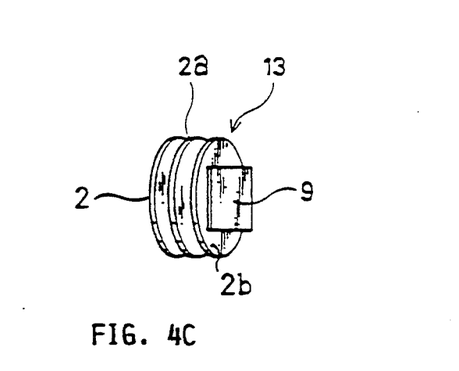

FIGS. 4A to 4C show schematic views of steps for manufacturing the radiating fin shown in FIG. 1. Referring to FIG. 4A, a blank 10 made of a Mo—Cu composite material is formed to become the connecting member 9 of the radiating fin 13 shown in FIG. 1. A further blank 11 made of aluminum becomes the fin 13. The junction between blank 10 of Mo—Cu composite material and the aluminum blank 11 is formed by a friction welding, in which junction surfaces of the two are brought into contact with each other and rotated in opposite directions while applying pressure as indicated by the arrows in FIG. 4A.

In friction welding the aluminum blank 11 and the Mo—Cu blank 10, appropriate conditions for connection must be set to provide a stable junction strength, since the characteristics of both materials such as rigidity, toughness and so on differ substantially.

When the connection surfaces of the aluminum blank 11 and of the Mo—Cu composite material blank 10 contact each other the blanks 10, 11 are rotated in opposite directions while pressure is being applied to the blanks, an aluminum oxide film 12 is discharged externally at the connection surface or interface, as shown in FIG. 4B. This phenomenon will be described in detail below with reference to the figures.

Referring to FIG. 4C, the radiating fin 13 having the fin sections 2, 2a, and 2b and the connecting member 9 is formed by a cutting or machining operation, whereby the Mo—Cu composite material blank 10 becomes the connecting member 9 and the aluminum blank 11 becomes the fin 13.

By this method, a perfect coupling or bonding without any cavity formation at the junction or interface has been provided. In addition, the formation of a solid solution layer of copper and aluminum having a low thermal conductivity has been avoided at the interface during the friction welding. Consequently, a radiating fin having a superior thermal conductivity has been provided. In addition, any plating process after the friction welded connection has been formed is facilitated, since metals such as are conventionally included in the solder, are avoided according to the invention.

In order to provide a sufficient junction strength, the oxide film existing on the connecting surface of aluminum blank 11 must be removed, and therefore the shape of the connecting surface, the number of rotations and the pressure must be set in taking this point in consideration.

Results of the friction welding of aluminum and a Mo—Cu composite material under various conditions will be described in the following.

Embodiment 1

FIGS. 5A to 5E show different states as the friction welding progresses. The blank 10 of Mo—Cu composite material and the blank 11 of aluminum have a flat junction surface in FIG. 5A. The aluminum blank 11 has an aluminum oxide film 12 formed on its surface. Referring to these figures, when the junction surfaces 30 are flat to begin with, a deformation during friction welding occurs on the side of the aluminum blank 11, since the toughness of the Mo—Cu composite material blank 10 is higher than that of the aluminum blank 11. Conditions of friction welding sufficient to externally remove the aluminum oxide film 12 out of the junction surface 30 must be selected. The junction strength (Kg/mm$^2$) at various states were obtained by using a sample having the shape of FIG. 8A. The results are shown in Table 3.

TABLE 3

Figure 5A:
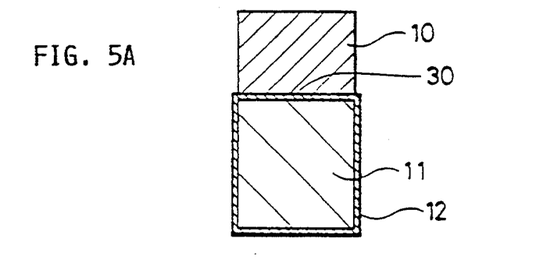
FIGS. 5A to 5E are sectional views showing the steps of manufacturing the radiating fin in accordance with another embodiment of the present invention.
Figure 5B:
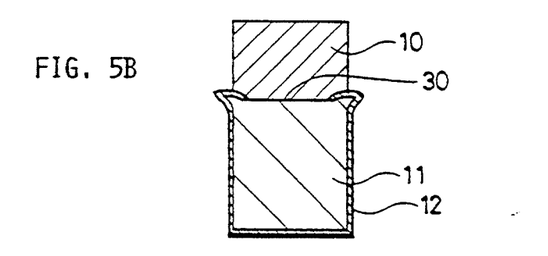
Figure 5C:
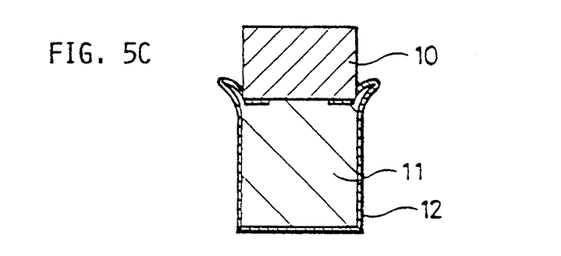
Figure 5D:
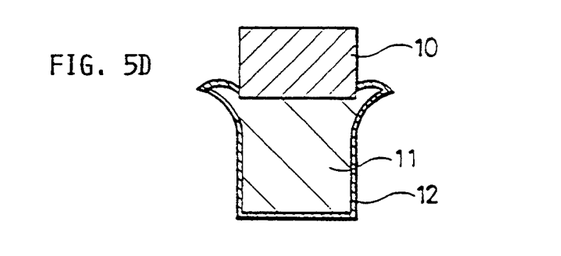
Figure 5E:
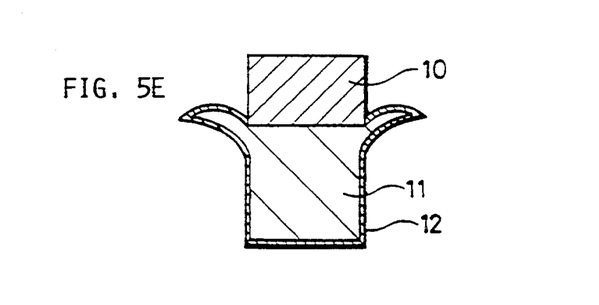

| Friction time (sec) | 2 | 4 | 6 | 8 |
|---|---|---|---|---|
| Deformation | FIG. 5B | FIG. 5C | FIG. 5D | FIG. 5E |
| Junction Strength (kg/mm$^2$) | 3.5 | 15.3 | 15.4 | 15.3 |

(1) Material: Aluminum (6061 type) 30 × 30 mm Mo—Cu composite (Mo 85% Cu 15%) 30 × 30 mm
(2) Conditions of friction welding: Number of rotation 1500 rpm, pressure 5 kg/mm$^2$ Embodiment 2

FIGS. 6A to 6E show a friction welding operation of the aluminum blank 11 and an Mo—Cu composite blank 20 with a tip having a tip angle $\alpha$ of 120°, whereby the progression of the deformation as a function of time is illustrated. As shown, the tip penetrates and displaces the aluminum oxide film 12. The junction strength (Kg/mm$^2$) at respective states were obtained by using a sample having the shape of 8B. The results are shown in Table 4.

TABLE 4

Figure 6A:
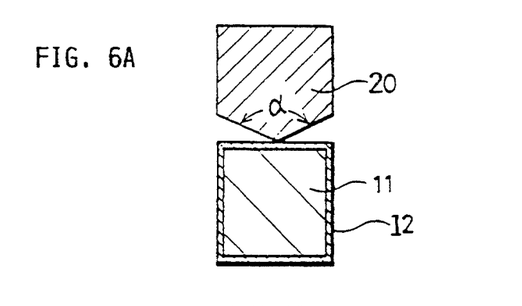
FIGS. 6A to 6E are sectional views showing the steps of manufacturing the radiating fin in accordance with still another embodiment of the present invention.
Figure 6B:
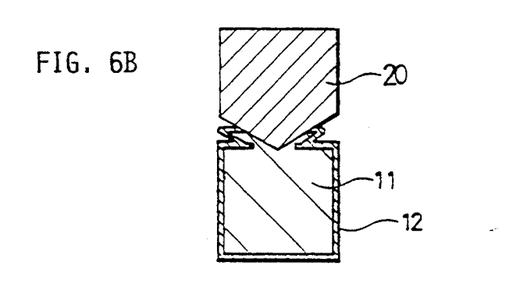
Figure 6C:
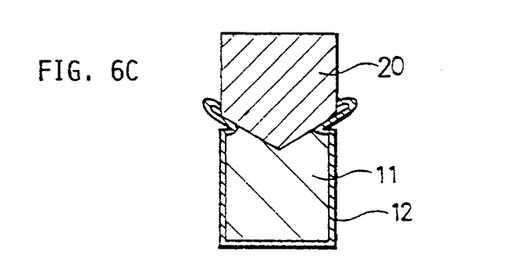
Figure 6D:
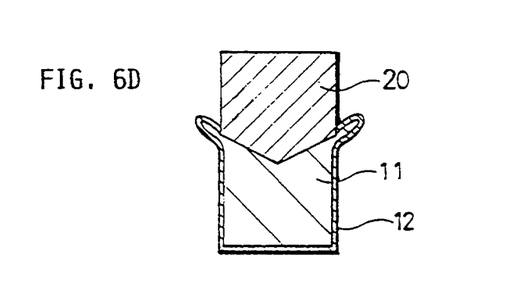
Figure 6E:
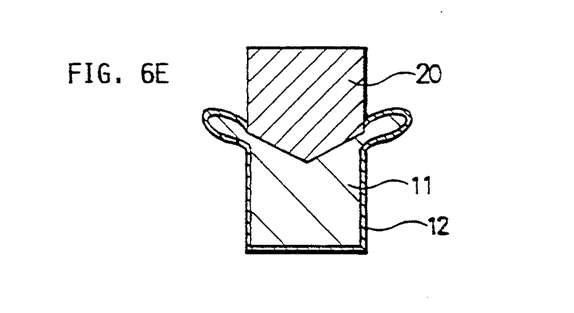

| Friction time (sec) | 2 | 4 | 6 | 8 |
|---|---|---|---|---|
| Deformation | FIG. 6B | FIG. 6C | FIG. 6D | FIG. 6E |
| Junction Strength | 23.5 | 24.2 | 24.2 | 24.0 |

TABLE 4-continued (kg/mm$^2$)

(1) Material: Aluminum (6061 type) 30 × 30 mm Mo—Cu composite (Mo 86% Cu 15%) 30 × 30 mm
(2) Lip Angle ($\alpha$): 120°
(3) Conditions of friction welding: Number of rotation 1500 rpm, pressure 5 kg/mm$^2$ According to this embodiment, since the tip of the Mo—Cu composite material blank 20 has a conical shape, the friction welding starts at a small area at the central portion of the tip surface of the aluminum blank 11, so that removal of the aluminum oxide film 12 from the junction surface is facilitated, and the junction strength has beem improved compared to Table 3.

Embodiment 3

FIGS. 7A to 7D are cross-sectional views of the junction structure provided when the tip angle of the Mo—Cu composite material blanks 10, 10a, 10b, and 10c is 180° (flat), 160°, 120° and 80°, respectively for studying the influence of the shape of the junction surface on the junction strength. The results are shown in Table 5.

TABLE 5

Figure 7A:
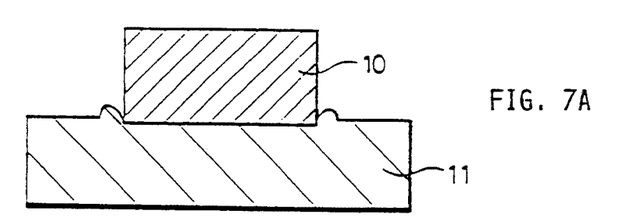
FIGS. 7A to 7D show sectional views of a junction structure illustrating the depth of penetration of a tip portion of a connecting member into a fin portion as a result of the friction welding, when the angle of the tip portion of a Mo—Cu composite material is changed, whereby the shape of junction surface influences the junction strength.
Figure 7B:
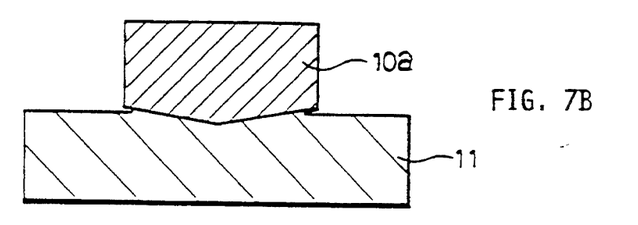
Figure 7C:
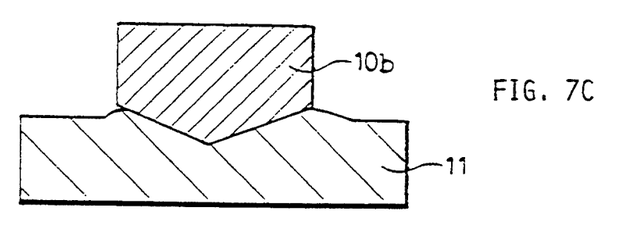
Figure 7D:
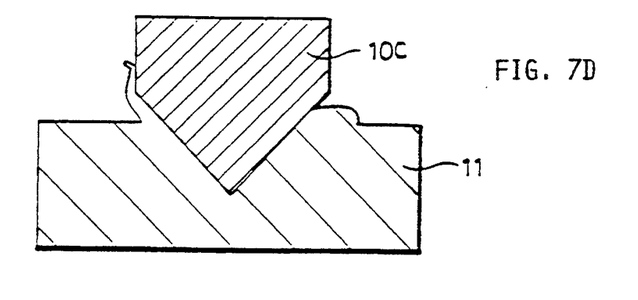

| Edge angel | | 180° | 160° | 120° | 80° |
|---|---|---|---|---|---|
| Deformation | | FIG. 7A | FIG. 7B | FIG. 7C | FIG. 7D |
| Junction | kg/mm$^2$ | 12.7 | 20.7 | 24.6 | 22.5 |
| Strength | deviation | 4.1 | 1.9 | 1.0 | 0.6 |

(1) Material: Aluminum (6061 type) 30 × 30 mm Mo—Cu composite (Mo 86% Cu 15%) 30 × 30 mm
(2) Conditions of Friction Welding: Number of rotation 1500 rpm, pressure 5 kg/mm$^2$
(3) Friction time: 6 sec
(4) No. of Samples: 5 each
(5) Junction strength (kg/mm$^2$): mean value of 5 samples
(6) Deviation: difference between Min and Max values.

As is apparent from Table 5, by providing a tip angle at the junction surface of the Mo—Cu composite material blank, the junction strength can be improved. A junction strength (kg/mm$^2$) of about 10 kg/mm$^2$ is sufficient for actual use.

Embodiment 4

Figure 9:
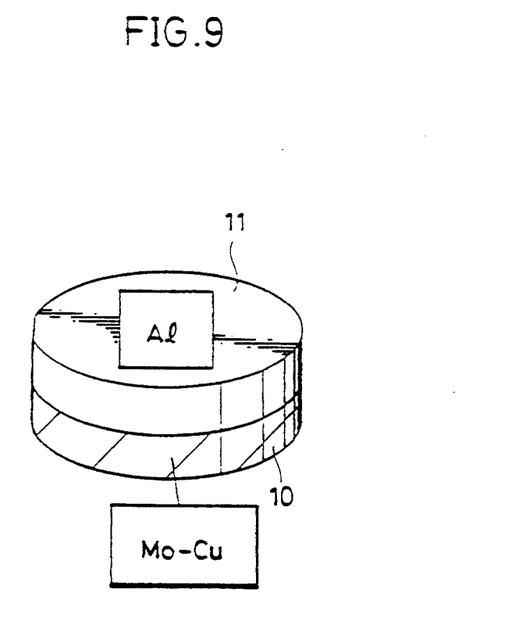
FIG. 9 is a perspective view of a sample for measuring the thermal conductivity of the radiating fin in accordance with the present invention.
Figure 10:
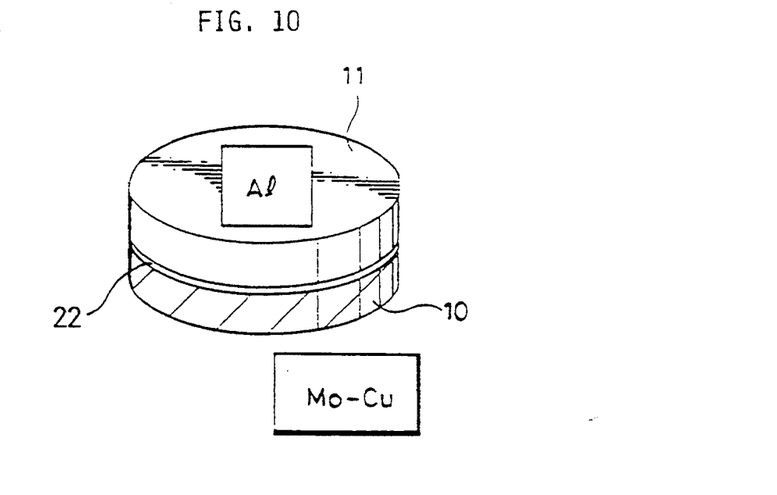
FIG. 10 is a perspective view of a sample for measuring the thermal conductivity of a conventional radiating fin in which a Mo—Cu composite material and aluminum are connected by soldering.

The thermal conductivity of the body resulting from the friction welding of the two blanks 10 and 11 shown in FIG. 9 and thermal conductivity of a body resulting from a soldering operation with a solder 22 shown in FIG. 10, were compared. Five samples were fabricated, respectively, and thermal conductivities of these samples were measured. Measurement of the thermal conductivity was carried out by the laser flash method, measured from the side of the Mo—Cu composite material blank 10. The results are shown in Table 6.

TABLE 6

| FIG. 9 | .662 | .605 | .605 | .595 | .606 |
|---|---|---|---|---|---|
| FIG. 10 | .428 | .431 | .465 | .451 | .443 |

(1) Unit: cm$^2$/sec
(2) Material: Aluminum (6061 type) Mo—Cu composite (Mo 85% Cu 15%)

As is apparent from Table 6, the thermal conductivity of the body formed by friction welding of the Mo—Cu composite material 10 and the aluminum 11 is considerably larger than that of the body formed by the solder 22.

Although the connecting member was formed of a Mo—Cu alloy or a Cu—W alloy in the above embodiments, the present invention is not limited to this but an Au—Si alloy may be used to provide the same effect.

Although aluminum was used for making the fin in the above described embodiments, the present invention is not limited to this, and an Al alloy having other elements added, for example, Al—Si alloy may be used. In addition, an iron family element not higher than 20 wt % may be added to provide a stronger frame of W or Mo. By adding such element, the degree of sintering of W or Mo is also improved.

As described above, the radiating fin in accordance with the present invention is light, since aluminum alloy is used for making the fin. Since the connecting member 9 formed of a composite material selected from the group consisting of Mo—Cu, Cu—W and Al—Si and the fin 13 are friction welded and in tight contact at the interface, they are firmly connected by a metallic bond.

In addition, Mo—Cu, Cu—W and Al—Si have superior thermal conductivity, and a solder that could decrease the thermal conductivity existing at the interface between the fin and the connecting member has been avoided. Therefore, the present radiating fin has a superior thermal conductivity compared to the prior art.

Since the difference between the thermal expansion coefficient of the connecting member and that of the material of the package is small, a thermal distortion is avoided at the junction between the package and the connecting member. Therefore, the radiating fin is firmly connected to the package, thereby increasing the life thereof.

Embodiment 5

In the embodiment 1 the aluminum of the blank 1 becomes soft due to the friction heat generated during the friction welding. The softness of the aluminum of the blank 11 makes it difficult to apply sufficient pressure to the connecting member, whereby the junction strength between the two blanks 10 and 11 may be decreased.

Figure 15A:
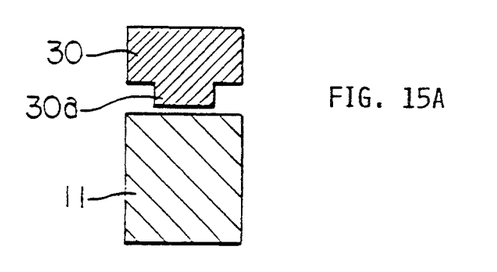
FIGS. 15A to 15C show sectional views similar to FIG. 5 illustrating the penetration of a portion of the connecting member into the fin.
Figure 15B:
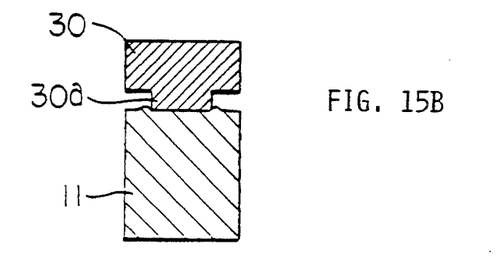
Figure 15C:
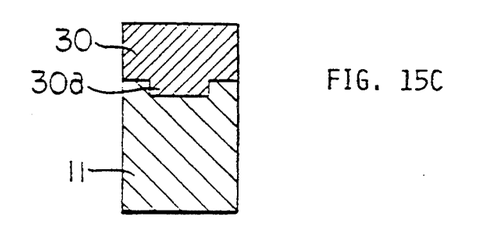

The Embodiment 5 prevents this decrease by providing a connecting member 30 with a projection 30a as shown in FIG. 15A. In FIG. 15B the friction welding has begun and the illustration is substantially the same as in FIG. 7A. As the friction welding progresses, the state shown in FIG. 15C is achieved, whereby the projection 30a of the connecting member 30 has penetrated into the aluminum blank 11 which has a cross-sectional dimension of 30×30 mm. The connecting member 30 has an upper wider end with a diameter of 30 mm and an axial length of 10 mm, and a lower narrower end with a diameter of 15 mm and an axial length of 3 mm.

The junction strength was measured and the respective results for FIG. 15B and FIG. 15C are shown in Table 7.

TABLE 7

| Friction Time (sec) | 4 | 6 |
|---|---|---|
| Deformation | FIG. 15B | FIG. 15C |
| Junction Strength (kg/mm$^2$) | 26.0 | 26.0 |

The material for the blank 11 was aluminum (type 6061) and the material of the blank 30 and its projection 30a was an Mo—Cu composite (Mo 85% Cu 15%). The friction welding was performed at an r.p.m. of 1500 r.p.m. at a pressure of 5 kg/mm$^2$.

Figure 8A:
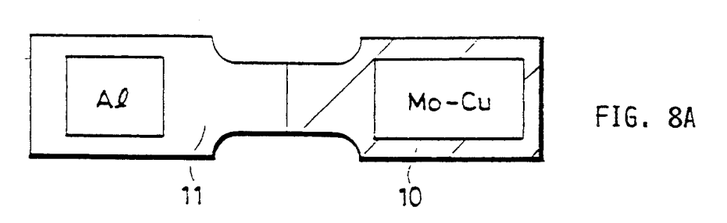
FIGS. 8A and 8B show two structures of a sample for measuring the junction strength between the radiating fin and the connecting member of the present invention.
Figure 8B:
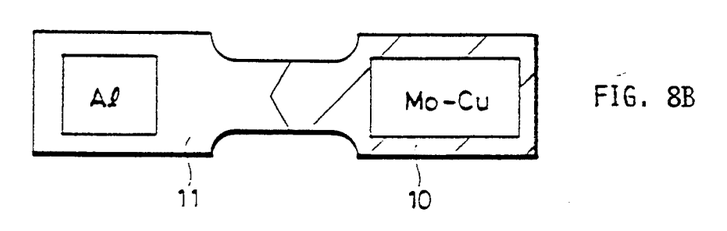

The junction strength was measured on a sample having a configuration as shown in FIG. 8A, with a diameter of 10 mm of the central, necked-down portion. Comparing Tables 7 and 3 with each other, it is seen that the Embodiment 5 has a much improved junction strength compared to that of Embodiment 1. The improvement is believed to result from the fact that the projection 30a of the Mo—Cu blank 30 is hard and less susceptible to thermal deformation during the friction welding operation. Thus, it is possible to use a reduced contact area, namely that of the projection 30a which will reduce the friction heat and thus the thermal deformation of the aluminum blank 11. As a result, the welding pressure can be increased, which in turn increases the junction strength.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a heat radiating fin, a semiconductor element, a semiconductor packaging device for accommodating said semiconductor element, means for attaching said heat radiating fin to said packaging device for externally diffusing heat generated by said semiconductor element, said heat radiating fin being made of a member selected from the group consisting of pure aluminum and an aluminum alloy; said means for attaching comprising a connecting member made of a composite material selected from the group consisting of Mo—Cu, Cu—W and Al—Si and a rotational friction welding between said connecting member and said heat radiating fin, said rotational friction welding penetrating an aluminum oxide film on said heat radiating fin thereby forming an alloying metallic bond directly between said heat radiating fin and said connecting member.

2. The device according to claim 1, wherein said Mo—Cu composite material has a copper content within the range of 2 to 30 wt. %.

3. The device according to claim 1, wherein said Mo—Cu composite material has a specific gravity within the range of 9 to 10 g/cc.

4. The device according to claim 1, wherein said Mo—Cu composite material or said Cu—W composite material includes an iron family element.

5. The device according to claim 4, wherein said iron family element is present up to and including 20 wt. % at the most.

6. The device according to claim 1, wherein said Cu—W composite material has a copper content within the range of 2 to 30 wt. %.

7. The device according to claim 1, wherein an interface between said fin and said connecting member is flat.

8. The device according to claim 1, wherein said connecting member has a conical tip for penetrating into said fin.

9. The device according to claim 8, wherein said tip has a tip angle of 160° at the most.

10. The device according to claim 1, wherein said Al alloy comprises an Al—Si alloy.

11. The device of claim 1, wherein said connecting member has a projecting portion reaching into said heat radiating fin to form said friction welding metallic bond.

12. The semiconductor device according to claim 1, wherein said rotational friction welding between said connecting member and said heat radiating fin has been formed by bringing junction surfaces into contact and by rotating said connecting member and said heat radiating fin in directions opposite to each other while applying pressure in a direction of the axis of rotation.

* * * * *